(12) United States Patent
Bedrosian et al.

(10) Patent No.: US 6,399,880 B1
(45) Date of Patent: Jun. 4, 2002

(54) APPARATUS AND METHOD FOR ELECTROMAGNETIC SHIELDING

(75) Inventors: Paul S. Bedrosian, Andover, MA (US); David C. Wojewoda, Londonderry, NH (US); Harold Allan Simpson, Andover; James L. Brandner, Haverhill, both of MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/633,457

(22) Filed: Aug. 8, 2000

(51) Int. Cl.⁷ .................................................. H05K 9/00
(52) U.S. Cl. ........................ 174/35 GC; 174/35 R; 361/816; 361/818
(58) Field of Search .................... 174/35 R, 35 GC, 174/35 MS; 361/796, 797, 798, 799, 800, 816, 818; 439/92, 108, 95, 96; 277/919, 920

(56) References Cited

U.S. PATENT DOCUMENTS

| | | | | |
|---|---|---|---|---|
| 4,631,641 A | * | 12/1986 | Brombal et al. | 361/424 |
| 5,045,635 A | * | 9/1991 | Kaplo et al. | 174/35 GC |
| 5,202,536 A | * | 4/1993 | Buonanno | 174/35 GC |
| 5,286,318 A | | 2/1994 | Sims et al. | 156/71 |
| 5,746,326 A | * | 5/1998 | Hong | 211/41.17 |
| 5,770,822 A | * | 6/1998 | Abolitz et al. | 174/35 GC |
| 5,934,915 A | * | 8/1999 | Henningson et al. | 439/92 |
| 5,943,219 A | * | 8/1999 | Bellino et al. | 361/816 |
| 6,043,991 A | * | 3/2000 | Sorrentino | 361/818 |
| 6,075,205 A | | 6/2000 | Zhang | 174/35 GC |

* cited by examiner

Primary Examiner—Dean A. Reichard
Assistant Examiner—Carmelo Oliva
(74) Attorney, Agent, or Firm—Moser, Patterson & Sheridan, LLP (57) ABSTRACT

An electromagnetic interference (EMI) shielding system includes one or more electrically conductive gaskets placed between electronic circuit cards in a card rack. The conductive gaskets are affixed to circuit cards to form a conductive shield, at the end of the card rack that is nearest the door of the cabinet in which the card racks are mounted. A gasket is attached to each circuit card within a rack, the gasket "filling" the space between the faceplates of two adjacent circuit cards.

22 Claims, 7 Drawing Sheets

APPARATUS AND METHOD FOR ELECTROMAGNETIC SHIELDING

FIELD OF THE INVENTION

The invention relates to electromagnetic interference (EMI) and, more specifically, to the shielding of electronic systems for the suppression of EMI.

BACKGROUND OF THE INVENTION

When your older sister's electric hair dryer interrupted your viewing of "I Love Lucy"; that was electromagnetic interference (EMI). Although you may not have thought so at the time, the interference from a cabinet of electronics equipment is a far more serious form of EMI. Various regulatory bodies and technical associations have, over the years, issued increasingly strict regulations and standards regarding the allowable levels of EMI. One such standard, Bellcore GR-1089, which is hereby incorporated by reference, in its level three requirements dictates that EMI shielding doors are an inadequate method of suppressing EMI. That is, for level three compliance, electronic equipment housed within cabinets must not exceed threshold emission levels, even with the cabinet doors, which typically act to suppress EMI, open.

Providing ready access to the racks of electronics cards housed within a cabinet by opening a door, and the suppression of EMI, to some extent, work at cross purposes. There are several approaches to providing EMI shielding, some of which are discussed in U.S. Pat. No. 5,286,318 issued to Sims, et al, and U.S. Pat. No. 6,075,205 issued to Zhang, which are hereby incorporated by reference.

An EMI shielding method and apparatus that provides efficient and substantial shielding for electronics systems would therefore be highly desirable.

SUMMARY

An electromagnetic interference (EMI) shielding system in accordance with the principles of the present invention includes one or more electrically conductive gaskets placed between electronic circuit cards in a card rack. One or more such card racks are used to hold circuit cards within an electronics cabinet. The conductive gaskets are affixed to circuit cards to form a substantially continuous conductive shield at the front of a card rack, that is, at the end of the card rack that is nearest the door of the cabinet in which the card racks are mounted. The conductive shield thus formed may be connected to a reference potential, such as cabinet ground, for example.

In an illustrative embodiment, a gasket is attached to each circuit card within a rack, the gasket "filling" the space between the faceplates of two adjacent circuit cards. Each gasket includes a "knife edge", that overlaps a portion of the faceplate of the card to which it is attached. The knife edge eases the insertion and removal of an adjacent circuit card by deflecting the card into it's proper slot. That is, without the knife edge deflection, the insertion of a neighboring card may tend to tear the gasket from its mount; the knife edge tends to "shoehorn" the neighboring circuit card into the appropriate, adjacent, card slot. In this illustrative embodiment, the gasket is composed of fabric filled with a resilient, compressible, material and includes a stiffening member that supports the gasket in the lateral direction. The gasket extends the length of the faceplate and is grounded through contact with the faceplate or one or more latches located on the faceplate.

The shape of each gasket is similar to that of a hockey stick, with the narrow "handle" of the gasket designed to readily fit in the gap between adjacent circuit card faceplates. The broader section of the gasket is designed to fit snugly compressed between two adjacent circuit card faceplates, exerting force on the faceplates due to the nature of the resilient filling, and to thereby make low-impedance electrical contact along the length of the two faceplates. The "elbow" of the gasket, previously referred to as a knife edge, assists in the insertion of neighboring circuit cards, as previously described.

BRIEF DESCRIPTION OF THE DRAWINGS

The above and further features, aspects, and advantages of the invention will be apparent to those skilled in the art from the following detailed description, taken together with the accompanying drawings in which.

DETAILED DESCRIPTION

An electromagnetic interference (EMI) shielding system in accordance with the principles of the present invention includes one or more electrically conductive gaskets attached to one side of an electronics circuit card. A plurality of the circuit cards are placed in a car rack, or shelf, within an electronics cabinet. The cabinet may contain a plurality of card racks and access to the racks is provided by a door, or the open face of the cabinet. The gaskets, in combination with the conductive faceplates of the circuit cards, form a conductive shield at the end of the card rack that is nearest the cabinet opening.

Figure 1:
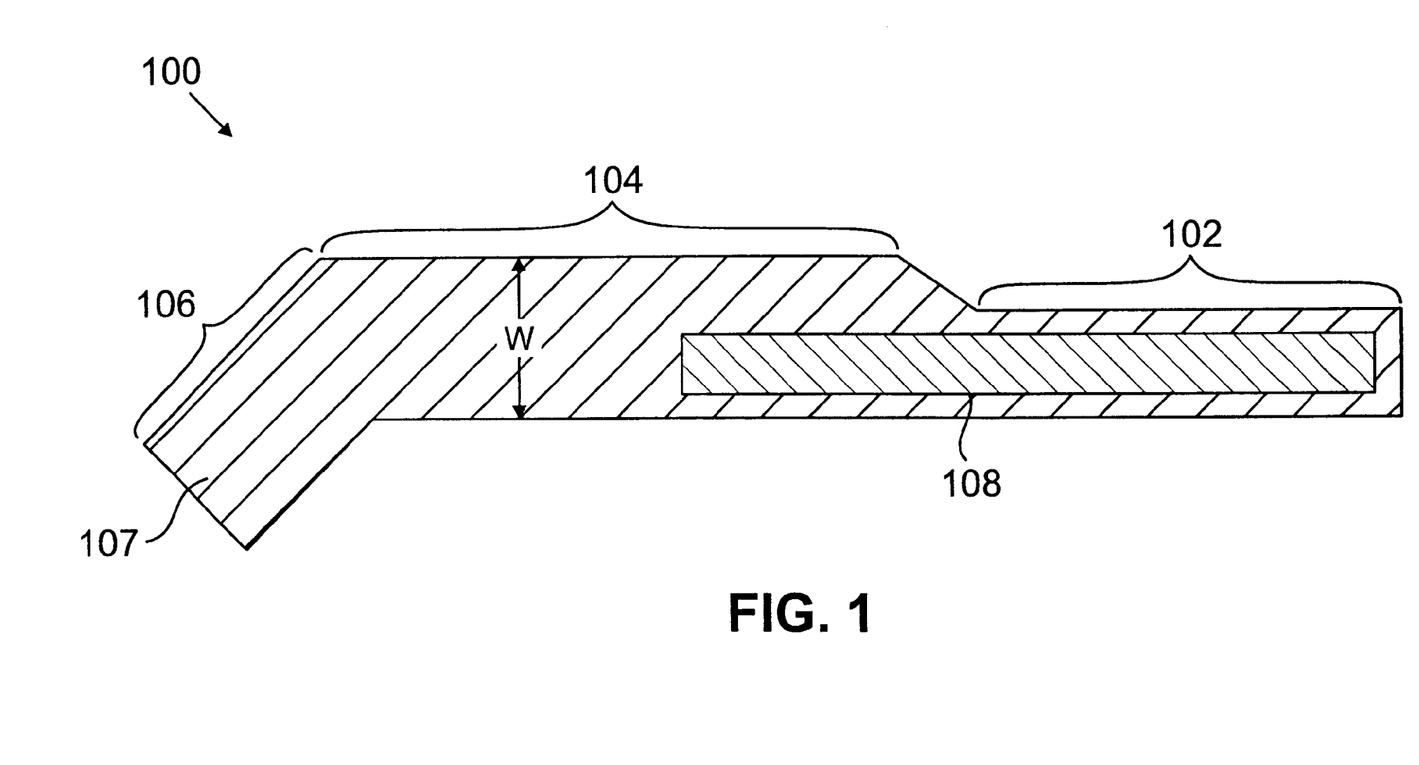
FIG. 1 is a top plan view of a EMI shielding gasket in accordance with the principles of the present invention.

In the top plan view of FIG. 1, a gasket 100 made of conductive, resilient, fabric, such as Nylon Rip Stock, Nickel/Cu, available from APM, Inc., of St Louis, Mo., includes a relatively narrow section 102 that affords easy entry into the space between circuit cards. A broad section 104 operates as a compression surface and is of a width W that is sufficient to make solid contact with the faceplate of a card placed in a card slot adjacent to the card to which the gasket 100 is affixed. Although this width may vary according to the inter-card spacing, the inter-card spacing is standard for many card racks and any minor variance in the inter-card spacing is accommodated by making the width W great enough to ensure that the broad section 104 is compressed, even if only slightly, by contact with an adjacent card's faceplate. The leading edge of the broad section 104 may be slanted or curved to permit easy entry into a card slot. At least the broad section 104 (and, in this illustrative embodiment, the gasket 100), is filled with a compressible resilient material, such as a fire rated urethane foam 107.

A "knife-edge" section 106 may be of the same width W, but offset at an angle, (approximately 30 degrees in this illustrative embodiment) from the plane of the narrow 102 and broad 104 sections. The knife edge section 106 facilitates the relatively easy entry of an adjacent card by removing the leading edge of the gasket from the path of the adjacent card as it is slid into its card slot and, at the same time, providing ample width for the insertion of the adjacent card. This and other aspects of the knife edge are further described in the discussion related to FIG. 5. A member 108 within the gasket provides lateral support for the gasket when the gasket is attached to a circuit card and is flexed, for example, by the action of an adjacent circuit card.

As is apparent from the top plan view of FIG. 1, the shape of each gasket is similar to that of a hockey stick, with the narrow "handle" 102 of the gasket designed to readily fit in the gap between adjacent circuit card faceplates. Once the circuit card to which the gasket 100 is attached has been inserted to the point that the broad section 104 makes contacts with the adjacent circuit card faceplates (see FIG. 3, for example), the narrow section 102 tends to pull the remainder of the gasket along into the gap between circuit cards.

Figure 2A:
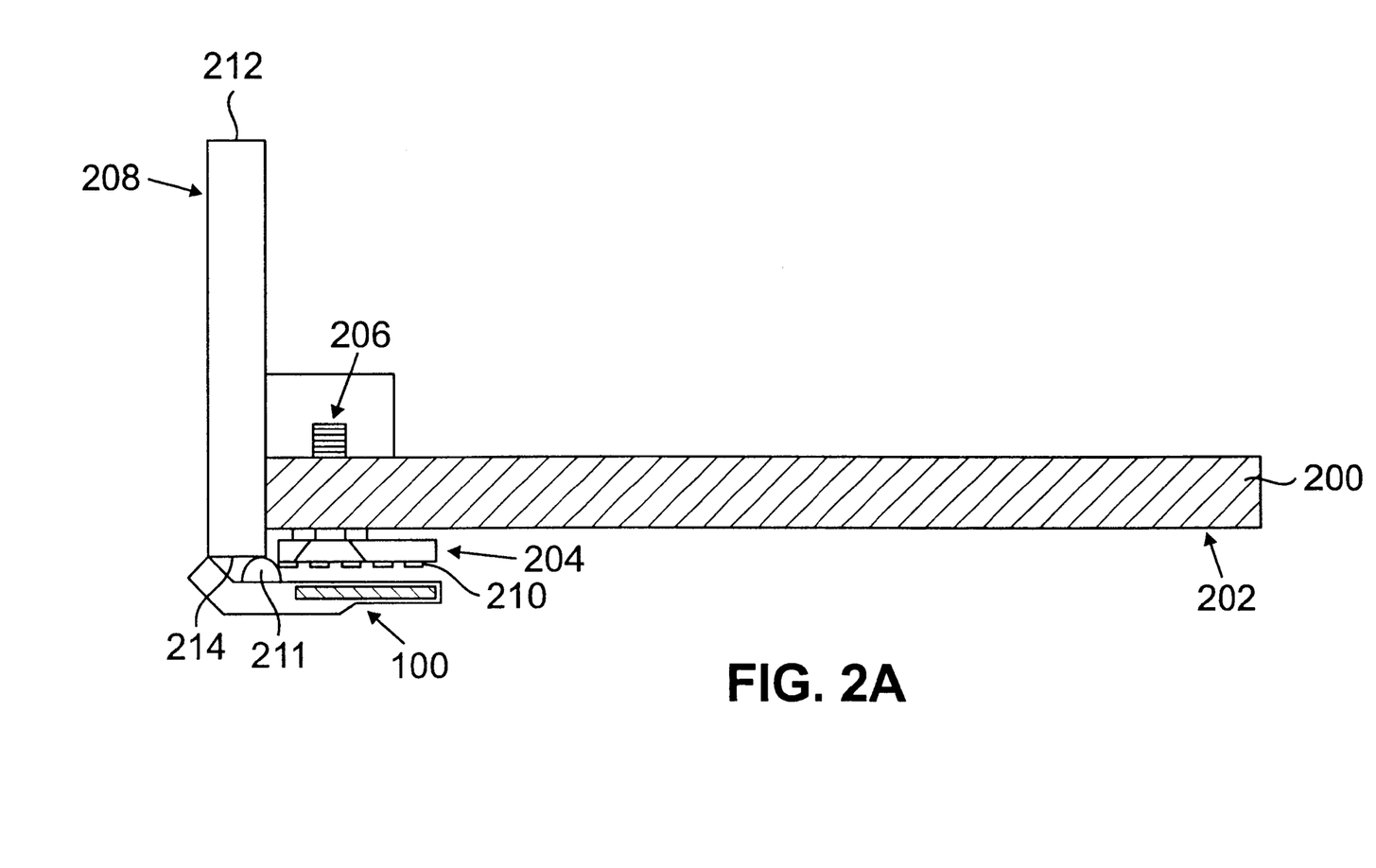
FIG. 2A is a top plan view of a circuit card with the shielding gasket of FIG. 1 attached and FIGS. 2B and 2C are elevation views of circuit cards having different profiles with a support member attached.

The top plan view of FIG. 2A illustrates a gasket 100 in accordance with the principles of the present invention attached to a circuit card 200. In this illustrative embodiment the gasket 100 is attached to the "wiring" side 202 of the card 200, with an intervening non-conductive element 204 providing support for the gasket 100. The support element 204 is attached to the card 200 using one or more faceplate screws 206, which normally are used to attach the faceplate 208 to the card 200 and, in this illustrative embodiment, serve double duty by also attaching the support element 204 to the card 200. The support element 204 extends away from the wiring side of the board to provide a platform for the gasket 100 aligned with the edge 211 of the faceplate 208. Although the wiring side 202 of the card 200 will typically be coated with a dielectric material, the use of a non-conductive, or dielectric material for the support element 204, further ensures that none of the printed wiring traces on the card surface are inadvertently shorted together.

Latch assemblies 213 and 215 provides a means for properly seating the card 100 within a card cage by amplifying the force applied by a technician to thereby supply the insertion force required by the plurality of pins in an edge connector that connects the circuit card to the backplane of the card cage. In this illustrative embodiment, the latch assemblies 213 and 215 provide a convenient path to system ground and, by virtue of direct contact with the latch assemblies 213 and 215, the gasket 100 is connected to ground. The gasket 100 may be attached to the support element 204 with an adhesive 210, such as 3M 9485PC available from 3M, Inc, St Paul, Minn. The knife edge 106, broad section 104, narrow section 102, and lateral support 108, of the gasket 100 are all visible in this view.

The broad section 104 of the gasket 100 is designed to fit snugly compressed between two adjacent circuit card faceplates, exerting force on the faceplates due to the nature of the resilient filling 107, and to thereby make low-impedance electrical contact along the length of the two faceplates. The circuit card faceplate 208 is composed of an electrically conductive material, such as aluminum. In order to further ensure that a substantially continuous conductive shield is formed by the faceplate/gasket combinations, the edges 212 and 214 of the faceplate 208 that come in contact with the gaskets 100 are treated with a non-oxidizing chemical conversion coating.

Figure 2B:
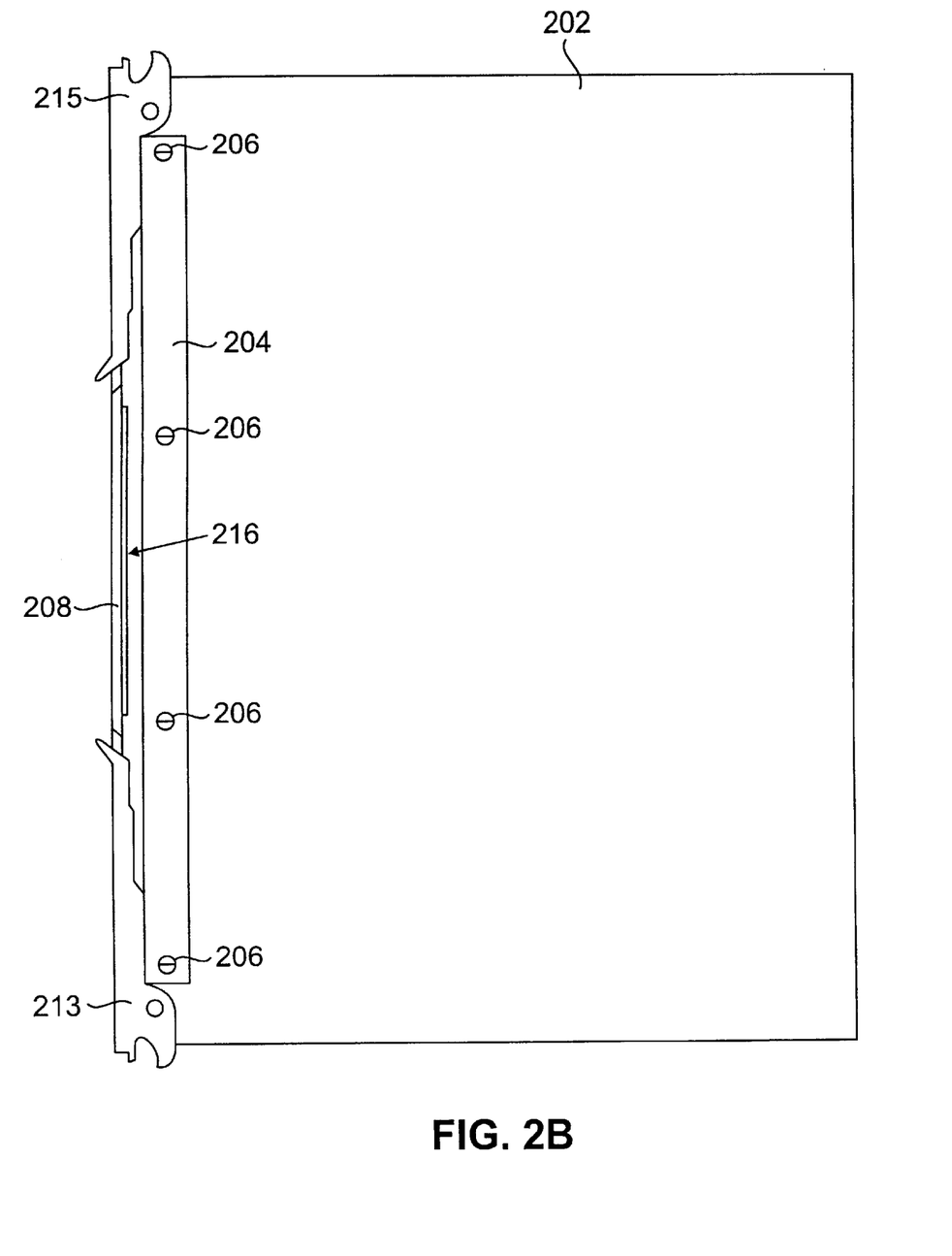
Figure 2C:
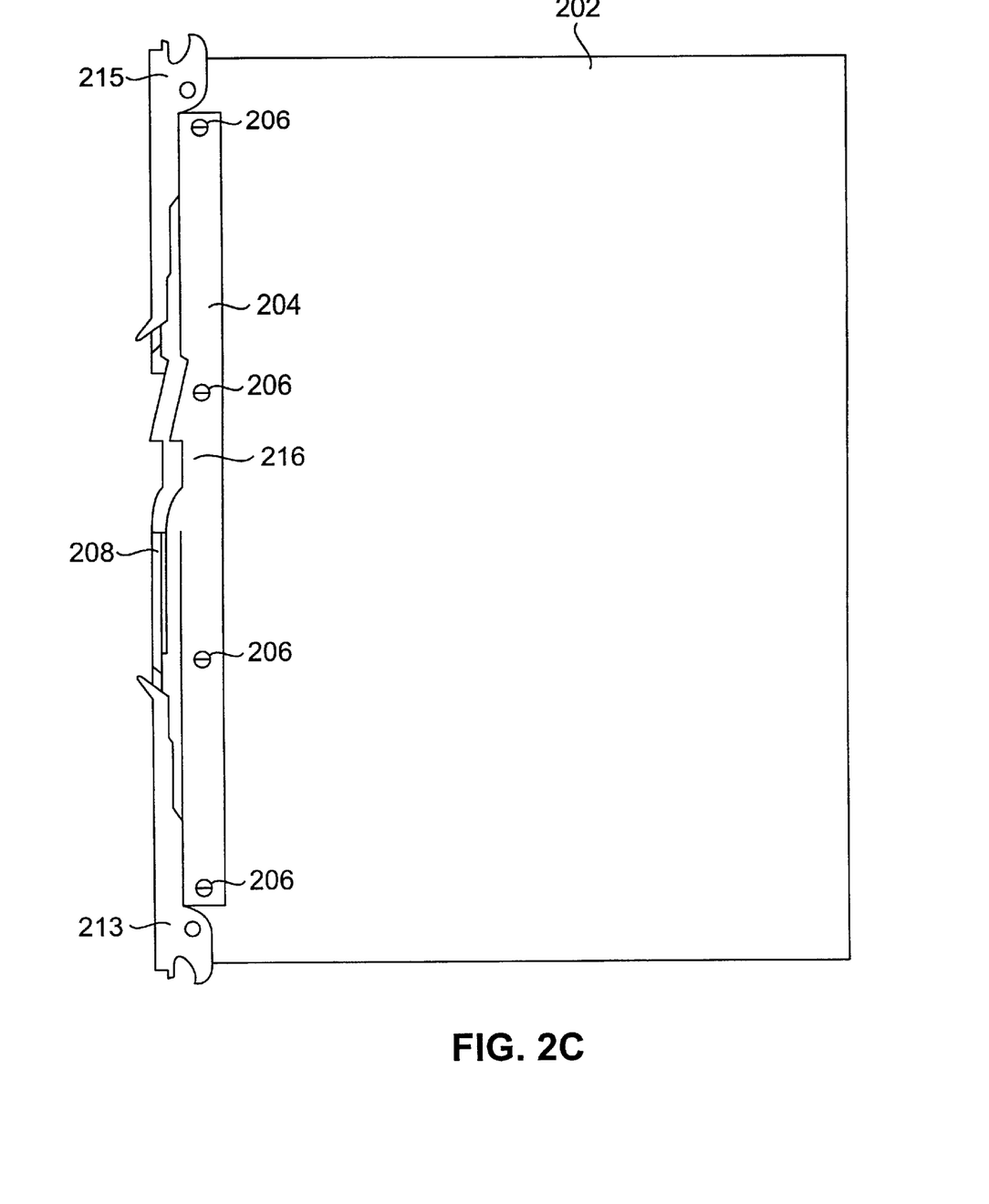

As illustrated in the elevation views of FIGS. 2B and 2C, the edge 216 of the support element 204 nearest the faceplate may generally conform to the profile of the faceplate, with, for example, the straight-line edge 216 of FIG. 2B conforming to the straight profile of the faceplate and the jagged edge 216 of FIG. 2C conforming to the corresponding faceplate profile of FIG. 2C.

Figure 3:
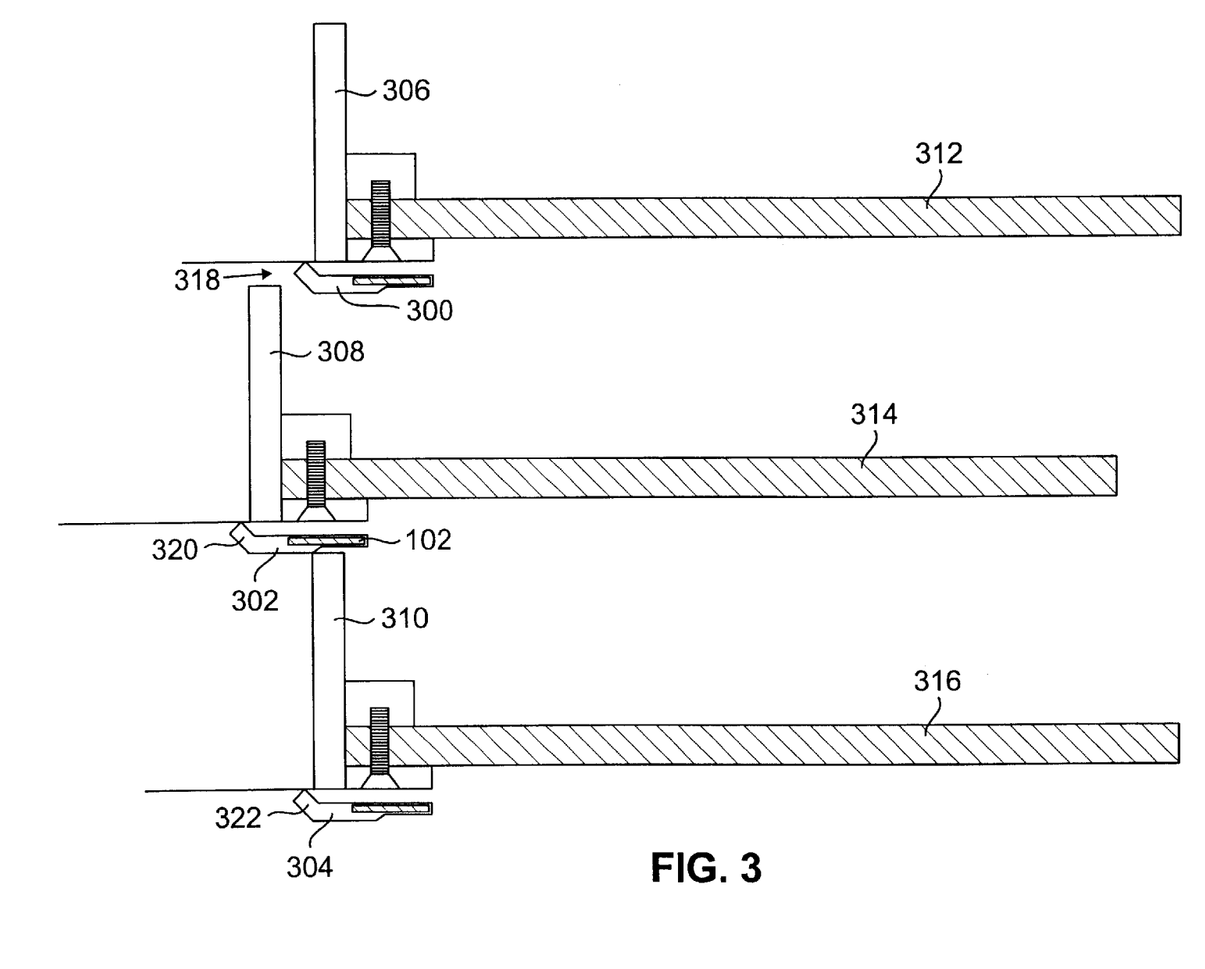
FIG. 3 is a top plan view of three circuit cards with attached EMI shielding gaskets, with one of the cards partially removed from the card cage in which the cards reside.

The top plan view of FIG. 3 illustrates the cooperation of a plurality of gaskets 300, 302, and 304 and faceplates 306, 308, and 310 in forming a substantially continuous EMI shield. A gasket 300, 302, and 304 is respectively attached to each of three illustrated circuit cards 312, 314, and 316 within a rack (not shown). The gaskets 300, 302, and 304 fill the spaces between the faceplates 306, 308, and 310 of each pair of adjacent circuit cards. The knife edges 318, 320, and 322, respectively of the gaskets 300, 302, and 304 overlap a portion of the faceplate 306, 308, and 310 of the card 312, 314, and 316 to which it is attached. The knife edges 318, 320, and 322 ease the insertion and removal of an adjacent circuit card. In this view, the card 314 is partially inserted between cards 312 and 316 and the narrow section 102 of the gasket 302 is between the faceplate 310 and the card 314 to which it is attached. As described in greater detail in the discussion related to FIG. 5, the gasket 100 extends the length of the faceplate 308.

Figure 4:
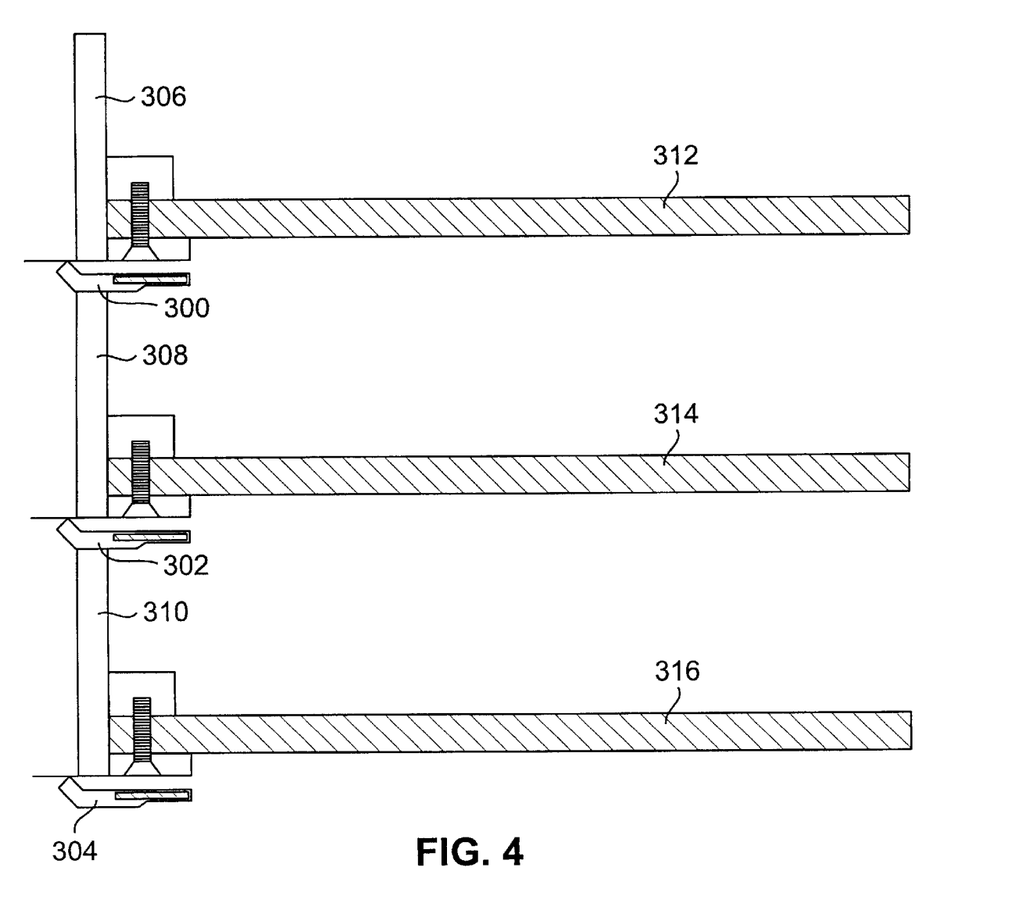
FIG. 4 is a top plan view of three circuit cards with attached EMI shielding gaskets, with all three cards seated in their respective card slots.

The top plan view of FIG. 4 provides a similar view of three cards of FIG. 5, with the card 314 fully inserted between cards 312 and 316 in this view. As will be apparent to one of skill in the art, the respective broad sections of each gasket 300, and 302 makes conductive contact with the faceplate 308 and 310, respectively, of a neighboring card. In this illustrative embodiment, if the card 316 were at one end of the card cage, the gasket 304 could make electrical contact with the conductive surface of the cabinet. Additionally, a gasket may be placed in the cabinet to make contact with a faceplate, such as faceplate 306 at the opposite end of the card cage.

Figure 5A:
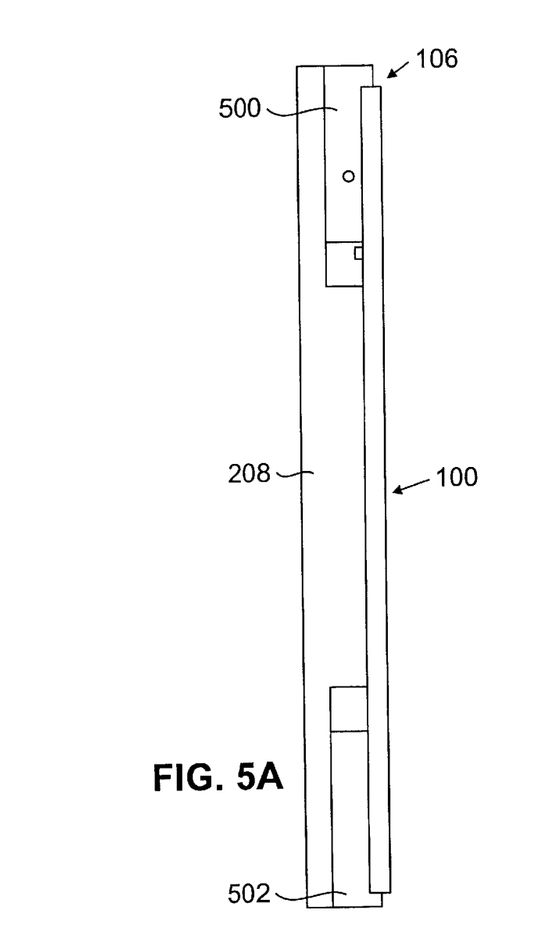
FIGS. 5A and 5B are, respectively, front and side elevation views of a circuit card with an EMI shielding gasket in accordance with the principles of the present invention attached.
Figure 5B:
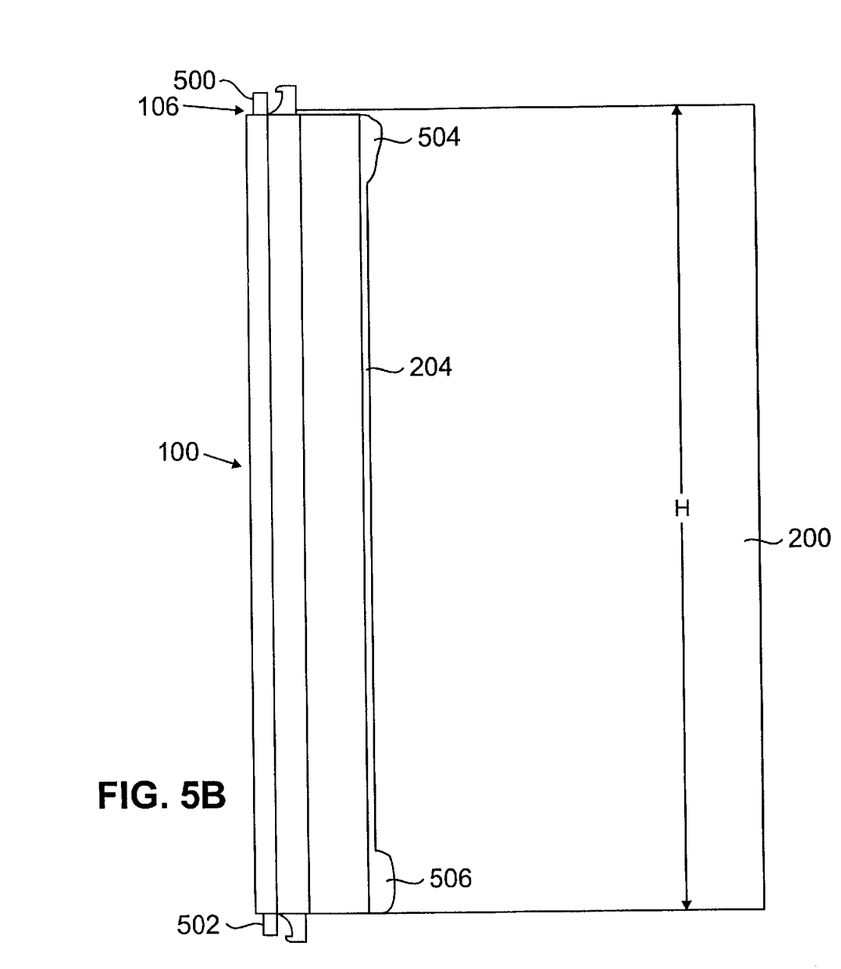

The front elevation view of FIG. 5A illustrates that the gasket 100 extends substantially the entire length of a corresponding faceplate 208 and that the knife edge 106 of the gasket 100 overlaps the faceplate. The side elevation view of FIG. 5B illustrates the that the gasket 100 extends substantially the entire height H of the circuit card 200 to which it and the faceplate are attached and to the end of the latches 500 and 502. Additionally, in this illustrative embodiment, in order to avoid interference with the latch mechanisms 500 and 502, the support member 204 does not extend the entire height of the circuit card 200 to which the gasket 100 is attached. The lateral support member 108 provides additional support to those sections 504 and 506 of the gasket 100 cantilevered over the ends of the support member 204.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. An apparatus for shielding electromagnetic interference (EMI) from a circuit card having a faceplate, the apparatus comprising:

a gasket for attachment to a circuit card, the gasket including:
   an exterior surface of a conductive fabric;
   a compression section for contact with a conductor that is adjacent to the circuit card and with the faceplate of the circuit card;
   a narrow section configured to fit between the circuit card to which it is mounted and the faceplate of an adjacent card to which the compression section makes electrical contact; and
   a section formed at an angle with the compression section, the angled section for admitting the faceplate of an adjacent circuit card; and
a support member mounted to the circuit card for supporting at least the narrow section the gasket and for aligning the gasket with an edge of the faceplate of the circuit card.

2. The apparatus of claim 1 wherein the compression section of the gasket comprises a conductive fabric filled with a compressible, resilient material.

3. The apparatus of claim 2 wherein the compressible resilient material is a fire rated urethane foam.

4. The apparatus of claim 1 further comprising lateral support member running the length of the gasket.

5. An EMI shielding system for an electronic circuit card comprising:
   a conductive faceplate for attachment to one end of the circuit card; and
   a gasket for attachment to the circuit card, the gasket including:
      an exterior surface of conductive fabric;
      a compression section for contact with a conductor that is adjacent to the circuit card and with the faceplate of the circuit card;
      a narrow section configured to fit between the circuit card to which it is mounted and the faceplate of an adjacent card to which the compression section is to make electrical contact; and
      a section formed at an angle with the compression section, the angled section for admitting the faceplate of an adjacent circuit card; and
   support member mounted to the circuit card for supporting at least the narrow section of the gasket and for aligning the gasket with an edge of the faceplate of the circuit card.

6. The system of claim 5 wherein the compression section of the gasket comprises a conductive fabric filled with a compressible, resilient material.

7. The system of claim 6 wherein the compressible, resilient material is a fire rated urethane foam.

8. The system of claim 5 wherein the faceplate includes an edge on the wiring side of the circuit board and the support member is attached to the wiring side of the circuit board.

9. The system of claim 8 wherein the support member aligns the edge of the faceplate on the wiring side of the circuit board with the gasket.

10. The system of claim 9 wherein the support member is composed of a dielectric material.

11. The system of claim 5 further comprising a lateral support member running the length of the gasket.

12. A shielding system for suppressing EMI in an electronic circuit cabinet having one or more racks of electronic circuit cards comprising:
   a plurality of circuit cards mounted in a card rack;
   an electrically conductive faceplate attached to one end of each card;
   an electrically conductive gasket attached to each card and extending the length of the faceplate, the gasket including:
      an exterior surface of conductive fabric;
      a compression section for contact with the faceplate and with a conductor that is adjacent to the circuit card;
      a narrow section configured to fit between the circuit card to which it is attached and the faceplate of an adjacent circuit card to which the compression section makes electrical contact; and
      a section formed at an angle with the compression section, the angled section for admitting the faceplate of an adjacent circuit card; and
   a support member mounted to each the plurality of circuit cards for supporting at least the narrow section of a respective one of the gaskets and for aligning a respective one of the gaskets with an edge of a respective one of the faceplates.

13. The system of claim 12 wherein the compression section of the gasket comprises a conductive fabric filled with a compressible resilient material.

14. The system of claim 13 wherein the compressible resilient material is a fire rated urethane foam.

15. The system of claim 14 wherein each faceplate includes an edge on the wiring side of the circuit board and each support member is attached to the wiring side of a circuit board.

16. The system of claim 15 wherein each support member aligns the edge of the faceplate on the wiring side of the circuit board with each gasket.

17. The system of claim 16 wherein the support member is composed of a dielectric material.

18. The system of claim 17 wherein each gasket is in electrical communication with cabinet ground.

19. The system of claim 18 wherein each gasket makes electrical contact with an adjacent faceplate through its compression section.

20. The system of claim 19 wherein each gasket makes electrical contact with an adjacent section of the cabinet.

21. The system of claim 20 wherein each gasket is attached to the cabinet to make electrical contact with a faceplate of an adjacent card through contact with the compression section of a respective one of the gaskets attached to the cabinet.

22. The system of claim 12 wherein each gasket further comprises:
   a lateral support member running the length of the gasket.

* * * * *